(12) United States Patent
Kaitoh et al.

(10) Patent No.: US 8,129,724 B2
(45) Date of Patent: Mar. 6, 2012

(54) DISPLAY DEVICE INCLUDING FIRST, SECOND, AND THIRD SEMICONDUCTOR FILMS

(75) Inventors: Takuo Kaitoh, Mobara (JP); Toshio Miyazawa, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 173 days.

(21) Appl. No.: 12/613,598

(22) Filed: Nov. 6, 2009

(65) Prior Publication Data
US 2010/0117091 A1    May 13, 2010

(30) Foreign Application Priority Data
Nov. 7, 2008   (JP) ................................. 2008-287182

(51) Int. Cl.
*H01L 27/14* (2006.01)

(52) U.S. Cl. .................... 257/72; 257/59; 257/E33.001; 438/149

(58) Field of Classification Search .................... 257/72, 257/59
See application file for complete search history.

(56) References Cited

U.S. PATENT DOCUMENTS
2005/0012097 A1*  1/2005 Yamazaki ........................ 257/59

FOREIGN PATENT DOCUMENTS
JP             05-055570           3/1993

* cited by examiner

*Primary Examiner* — Marcos D. Pizarro
*Assistant Examiner* — Eva Yan Montalvo
(74) *Attorney, Agent, or Firm* — Antonelli, Terry, Stout & Kraus, LLP.

(57) ABSTRACT

A display device including a transparent substrate, and a plurality of thin film transistors formed on the transparent substrate, wherein each of the thin film transistors have a gate electrode, a source electrode and a drain electrode, a first semiconductor film, an insulation film, a second semiconductor film, and a third semiconductor film. The third semiconductor film is connected with the source electrode and the drain electrode by an ohmic contact, and the second semiconductor film is formed below the third semiconductor film and has a resistance higher than resistance of the third semiconductor film.

5 Claims, 14 Drawing Sheets

DISPLAY DEVICE INCLUDING FIRST, SECOND, AND THIRD SEMICONDUCTOR FILMS

The present application claims priority from Japanese application JP 2008-287182 filed on Nov. 7, 2008, the content of which is hereby incorporated by reference into this application.

BACKGROUND OF THE INVENTION

1. Field of the Invention

The present invention relates to a display device which performs a display control of pixels using thin film transistors (TFT), and a manufacturing method of the display device.

2. Description of the Related Art

Conventionally, various studies have been made to enhance the performance such as electric characteristics of a thin film transistor made of amorphous silicon (a-Si). Here, to impart desired electric characteristics to a thin film transistor, for example, the studies have been also made toward the improvement of electron mobility or the like by increasing a crystal grain size of silicon while making use of a manufacturing process which is designed so as to maintain the structure of a thin film transistor to be made of amorphous silicon.

JP-A-5-55570 (patent document 1) discloses one example of such a related part, and FIG. 6 shows a thin film transistor having the bottom gate structure in the same manner as a thin film transistor described in patent document 1. In patent document 1, as shown in FIG. 6, a polycrystalline silicon (p-Si) layer is stacked below an amorphous silicon layer due to reasons attributed to the manufacture of the display device.

SUMMARY OF THE INVENTION

To focus on the thin film transistor shown in FIG. 6, an ON current flows in the polycrystalline silicon layer SP having large electron mobility. However, there exists a drawback with respect to an OFF current. That is, when a minus voltage is applied to a gate electrode GT, holes are induced in the polycrystalline silicon layer SP. Since there is no potential barrier between a drain electrode DT and the polycrystalline silicon layer SP as well as between a source electrode ST and the polycrystalline silicon layer SP, an electric current generated by holes directly flows in the drain electrode DT and the source electrode ST.

To overcome such a drawback, inventors of the present invention firstly studied the structure shown in FIG. 7. As shown in FIG. 7, the polycrystalline silicon layer SP and the amorphous silicon layer SA are covered with an impurity silicon layer (doped-Si) DS made of amorphous silicon doped with impurities. Due to such structure, it is possible to prevent passing of holes thus suppressing an OFF current. However, the polycrystalline silicon layer SP and the drain electrode DT, the source electrode ST are connected with each other via the impurity silicon layer DS, and this connecting portion is narrow and hence, the contact resistance is increased whereby an ON current becomes insufficient.

In view of the above, the inventors of the present invention have studied the structure shown in FIG. 8. To increase an ON current in the structure shown in FIG. 7, as shown in FIG. 8, an area where the drain electrode DT, the source electrode ST and a semiconductor film S are connected with each other is increased thus lowering the contact resistance. In forming such structure, firstly, an insulation film ES is formed in place of an amorphous silicon layer SA, and a portion of the semiconductor film S which is exposed from the insulation film ES is brought into contact with the impurity silicon layer DS.

In the structure shown in FIG. 8, as shown in a graph of FIG. 9A which indicates characteristics of a gate voltage and a drain current respectively, when a drain voltage is 1V, an ON current is sufficiently ensured and an OFF current can be also suppressed. However, when the drain voltage is 10V, an OFF current cannot be suppressed with the sole provision of the impurity silicon layer DS. That is, the potential difference between a drain-electrode-side edge portion DR of the semiconductor film S and a gate electrode is increased so that the strong concentration of electric field is generated at the drain-electrode-side edge portion DR leading to the increase of the OFF current. Accordingly, it is necessary to limit the drain voltage applied to the thin film transistor to 5V or less, for example. When it is necessary to set the drain voltage to a higher voltage, the suppression of an OFF current arises as a task to be solved.

It is an object of the present invention to provide a display device having thin film transistors which can acquire an appropriate ON current and an appropriate OFF current and a manufacturing method thereof which can suppress the increase of cost in a manufacturing process.

To overcome the above-mentioned drawbacks, according to one aspect of the present invention, there is provided a display device including: a transparent substrate; and a plurality of thin film transistors which are formed on the transparent substrate, each thin film transistor including: a gate electrode which is stacked on the transparent substrate; a source electrode and a drain electrode which are stacked over the gate electrode; a first semiconductor film which is stacked between the gate electrode, and the source electrode and the drain electrode so as to control an electric current which flows between the source electrode and the drain electrode; an insulation film which is stacked on the first semiconductor film in a contacting manner in a state where a source-electrode-side edge portion and a drain-electrode-side edge portion of the first semiconductor film are exposed; and a second semiconductor film and a third semiconductor film which are stacked between the source-electrode-side edge portion and the source electrode as well as between the drain-electrode-side edge portion and the drain electrode, wherein the third semiconductor film is connected with the source electrode and the drain electrode by an ohmic contact, and the second semiconductor film is formed below the third semiconductor film with resistance higher than resistance of the third semiconductor film.

Further, in the above-mentioned display device, the second semiconductor film may be made of a predetermined material, and the third semiconductor film is formed by adding impurities to the predetermined material.

Further, in the above-mentioned display device, the first semiconductor film may be made of polycrystalline silicon or microcrystalline silicon, the second semiconductor film is made of amorphous silicon, and the third semiconductor film is formed by adding the impurities to the amorphous silicon.

Further, in the above-mentioned display device, the second semiconductor film and the third semiconductor film may be integrally formed with the source electrode and the drain electrode respectively, the source electrode, and the second semiconductor film and the third semiconductor film which are integrally formed with the source electrode may cover a portion of the insulation film and the source-electrode-side edge portion, and the drain electrode, and the second semiconductor film and the third semiconductor film which are integrally formed with the drain electrode may cover a portion of the insulation film and the drain-electrode-side edge portion.

According to another aspect of the present invention, there is provided a manufacturing method of a display device including the steps of: forming a first semiconductor film which controls an electric current flowing between a source electrode and a drain electrode by an electric field which a gate electrode generates over the gate electrode; forming an insulation film by stacking the insulation film on the first semiconductor film in a contacting manner in a state where an outer peripheral portion of the first semiconductor film is exposed from the insulation film; forming a third semiconductor film which is connected with the source electrode and the drain electrode by an ohmic contact; forming a second semiconductor film having resistance higher than resistance of the third semiconductor film below the third semiconductor film by stacking; forming the source electrode and the drain electrode on the third semiconductor film by stacking and forming the source electrode and the drain electrode into desired shapes by etching; and in conformity with the shapes of the source electrode and the drain electrode formed in the step of forming the source electrode and the drain electrode, forming the third semiconductor film and the second semiconductor film into desired shapes by etching, and forming the outer peripheral portion of the first semiconductor film exposed from the source electrode and the drain electrode into a desired shape by etching.

Further, in the manufacturing method of the above-mentioned display device, the second semiconductor film may be formed by stacking a predetermined material in the step for forming the second semiconductor film, and in forming the third semiconductor film, the third semiconductor film may be formed by adding impurities while continuing stacking of the predetermined material in the step of forming the second semiconductor film.

Further, in the manufacturing method of the above-mentioned display device, the second semiconductor film may be formed by stacking a predetermined material in the step of forming the second semiconductor film, and the step of forming the third semiconductor film may include a step of continuing stacking of the predetermined material in the step of forming the second semiconductor film, and a step of implanting impurities into the predetermined material stacked by the step of continuing stacking of the predetermined material thus forming the third semiconductor film.

The present invention can appropriate an ON current and an OFF current in a thin film transistor of a display device while suppressing the increase of cost for manufacturing the display device.

DESCRIPTION OF THE PREFERRED EMBODIMENTS

Hereinafter, an embodiment of the present invention is explained in conjunction with drawings.

A display device according to one embodiment of the present invention is an IPS (In-Plane Switching)-type liquid crystal display device. The liquid crystal display device includes a TFT substrate on which scanning signal lines, video signal lines, thin film transistors, pixel electrodes, and common electrodes are formed, a counter substrate which faces the TFT substrate in an opposed manner and forms color filters thereon, and a liquid crystal material which is hermetically filled in a region sandwiched between both substrates. The TFT substrate is configured such that the thin film transistors and the like are formed on a transparent substrate formed of a glass substrate or the like.

Figure 1:
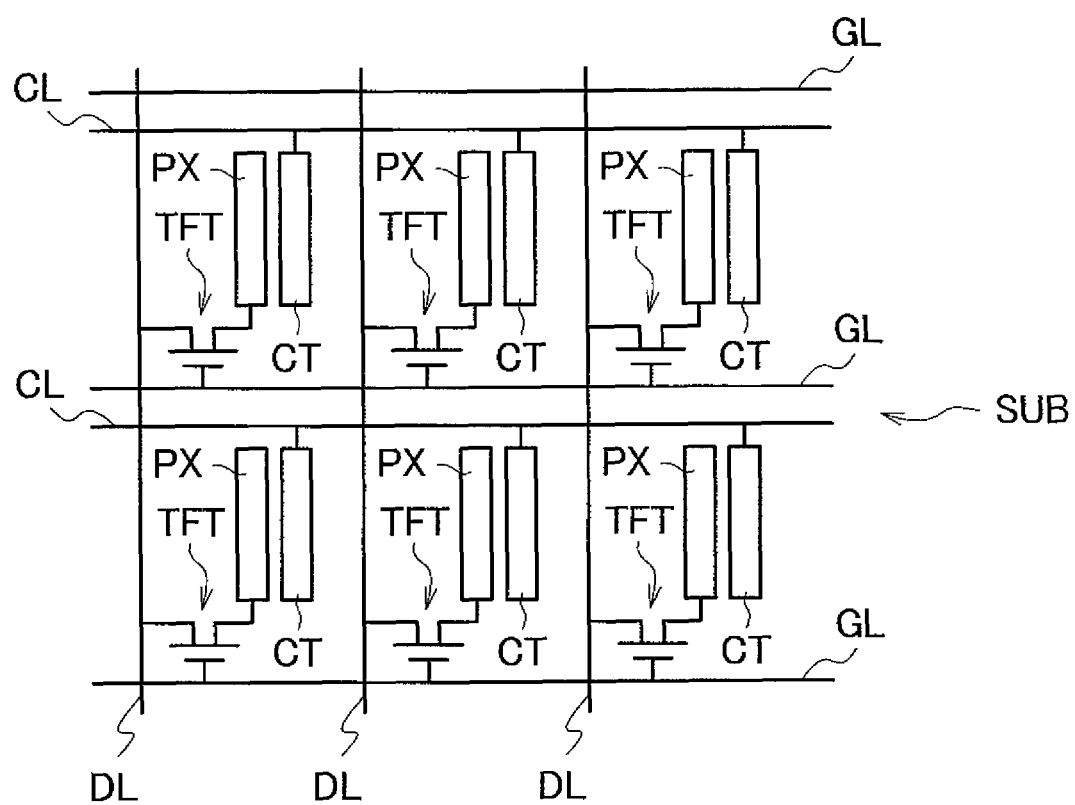
FIG. 1 is an equivalent circuit diagram of a TFT substrate which constitutes an IPS-type liquid crystal display device.
Figure 2:
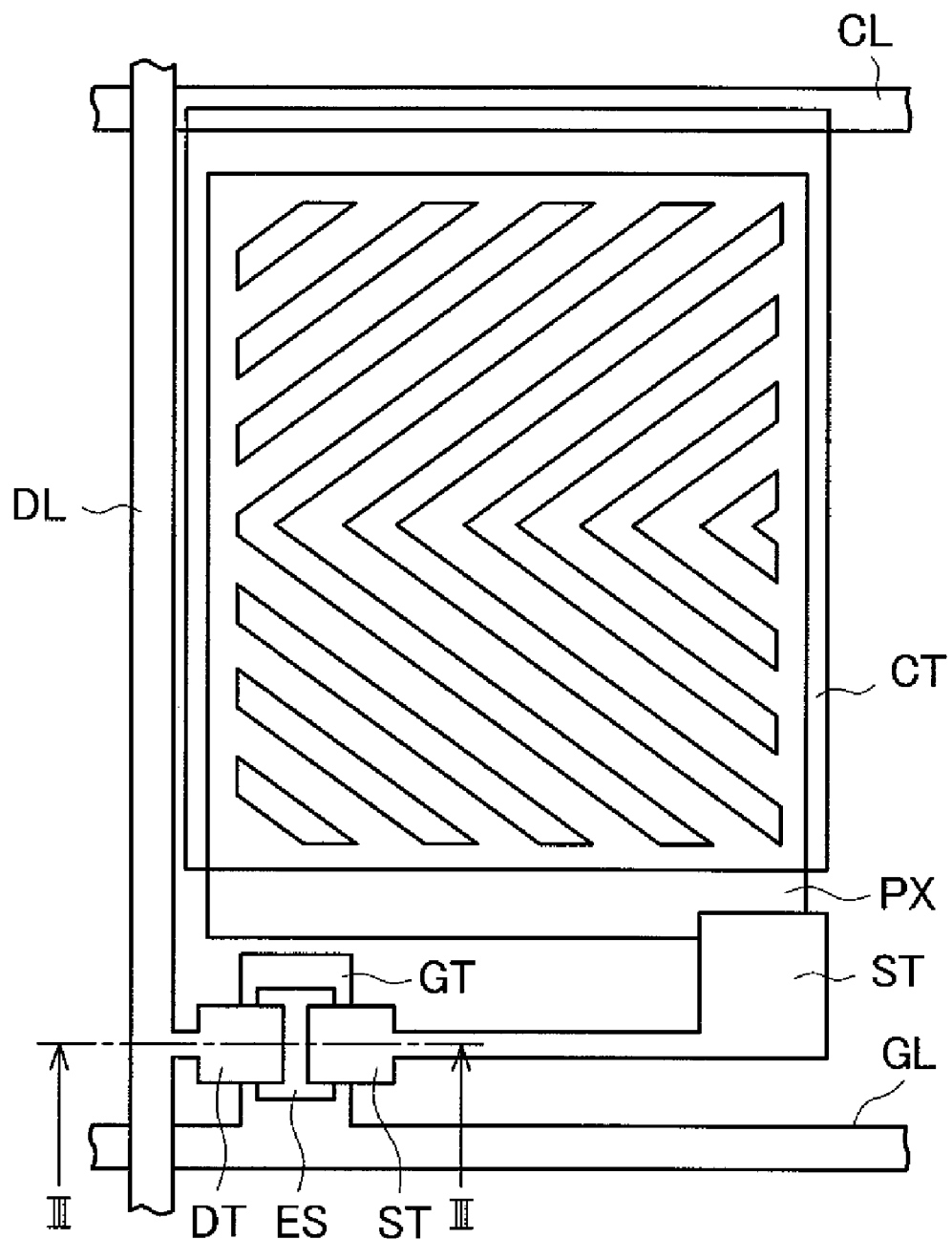
FIG. 2 is an enlarged plan view showing a pixel region of the TFT substrate according to an embodiment.

FIG. 1 shows an equivalent circuit diagram of the TFT substrate SUB of the above-mentioned liquid crystal display device. FIG. 2 is an enlarged plan view of one pixel region formed on the TFT substrate SUB.

In these drawings, on the TFT substrate SUB, a large number of gate signal lines GL extends in the lateral direction in the drawing at equal intervals, and a large number of drain signal lines DL extends in the longitudinal direction in the drawing at equal intervals. Respective pixel regions which are arranged in a matrix array are defined by the gate signal lines GL and the drain signal lines DL. Further, common signal lines CL extend in the lateral direction in the drawing parallel to the respective gate signal lines GL.

At a corner portion of the pixel region which is defined by the gate signal lines GL and the drain signal lines DL, a thin film transistor TFT having the MIS (Metal-Insulator-Semiconductor) structure is formed. A gate electrode GT of the thin film transistor TFT is connected to the gate signal line GL, and a drain electrode DT of the thin film transistor TFT is connected to the drain signal line DL. Further, a pair of a pixel electrode PX and a counter electrode CT is formed in each pixel region, the pixel electrode PX is connected to a source electrode ST of the thin film transistor TFT, and the counter electrode CT is connected to the common signal line CL.

In the above-mentioned circuit constitution, a reference voltage is applied to the counter electrodes CT of the respective pixels via the common signal lines CL and a gate voltage is applied to the gate signal lines GL so as to select a row of pixels. Further, at such selection timing, a video signal is supplied to the respective drain signal lines DL so that a voltage of the video signal is applied to the pixel electrodes PX of the respective pixels. Due to such an operation, a lateral electric field having a field strength corresponding to the potential difference between the pixel electrode PX and the counter electrode CT is generated, and the alignment of liquid crystal molecules is determined corresponding to the field strength of the lateral electric field.

As shown in FIG. 2, an insulation film ES is formed above the gate electrode GT which is connected to the gate signal line GL. Further, the drain electrode DT and the source electrode ST are formed such that these electrodes DT, ST partially overlap with a portion of the insulation film ES.

Figure 3:
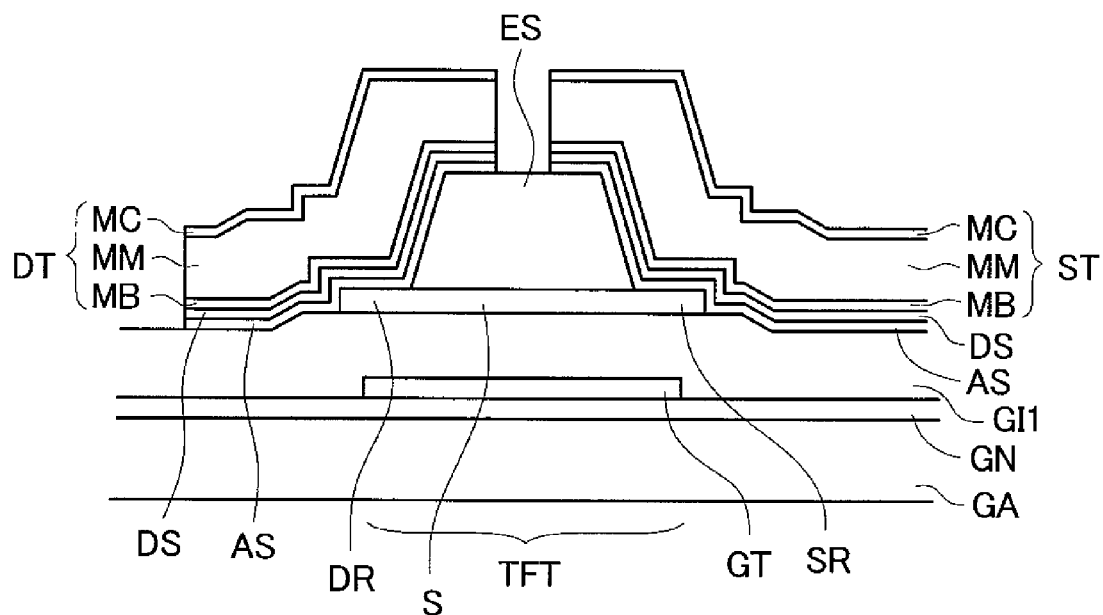
FIG. 3 is a cross-sectional view taken along a line III-III in FIG. 2.

FIG. 3 is a view showing a cross section of the thin film transistor TFT taken along a line in FIG. 2. The cross section is taken in the direction perpendicular to the direction along which the drain signal line DL extends. As shown in FIG. 3, in the thin film transistor TFT formed on the TFT substrate SUB, a first semiconductor film S is formed on the gate electrode GT by way of a gate insulation film GI1. The first semiconductor film S is provided for controlling an electric current which flows between the drain electrode DT and the source electrode ST corresponding to a voltage applied to the gate electrode GT. Further, the insulation film ES is formed on the first semiconductor film S in a state where the insulation film ES is in contact with an upper surface of the first semiconductor film S. The insulation film ES covers a region sandwiched between a source-electrode-side edge portion SR and a drain-electrode-side edge portion DR of the first semiconductor film S while exposing the source-electrode-side edge portion SR and the drain-electrode-side edge portion DR from the insulation film ES. A region of the first semiconductor film S defined below the insulation film ES mainly constitutes a channel region which controls an electric current flowing between the drain electrode. DT and the source electrode ST by an electric field generated by the gate electrode GT.

In this embodiment, particularly, a second semiconductor film AS made of amorphous silicon is formed on an upper surface of the drain-electrode-side edge portion DR and a portion of the insulation film ES, and a third semiconductor film DS made of amorphous silicon doped with impurities is formed on an upper surface of the second semiconductor film AS. The second semiconductor film AS and the third semiconductor film DS are also formed on and along the source-electrode-side edge portion SR and a portion of the insulation film ES in the same manner. The drain electrode DT is formed on the third semiconductor film DS which covers the drain-electrode-side edge portion DR, and the source electrode ST is formed on the third semiconductor film DS which covers the source-electrode-side edge portion SR. These third semiconductor films DS are connected with the drain electrode DT and the source electrode ST by an ohmic contact respectively. The concentration of impurities which become carriers in the second semiconductor film AS is set lower than the concentration of impurities in the third semiconductor film DS so that the second semiconductor film AS has resistance higher than resistance of the third semiconductor film DS.

Here, the ohmic contact implies a contact which exhibits a voltage-current characteristic having linearity at an electric contact portion between a line layer and a semiconductor film or the like. A material of the third semiconductor film DS is selected corresponding to a material of the drain electrode DT and the source electrode ST or the like. In this embodiment, the drain electrode DT and the source electrode ST are mainly made of aluminum, and the third semiconductor film DS is made of amorphous silicon doped with impurities such as phosphorous of high concentration. The second semiconductor film AS and the third semiconductor film DS are formed by etching with a mask having the same shape as the source electrode ST and the drain electrode DT and hence, the second semiconductor film AS and the third semiconductor film DS are formed in the same pattern shape as the source electrode ST and the drain electrode DT as viewed in a plan view.

The first semiconductor film S is formed using amorphous silicon as a material by a CVD method or the like, wherein amorphous silicon is formed into crystalline silicon such as micro crystalline silicon ($\mu$c-Si) or polycrystalline silicon by crystallization using a laser annealing technique. In general, a grain size of crystalline silicon is increased along with the growth of crystallinity of silicon in the first semiconductor film S so that mobility of electrons is enhanced. On the other hand, a required process temperature becomes high so that a process cost is pushed up. In this embodiment, the first semiconductor film S is made of crystalline silicon such as micro-crystalline silicon or polycrystalline silicon.

A grain size of micro-crystalline silicon falls within a range of approximately 10 nm to 100 nm, and the grain size of crystalline silicon in the semiconductor film S can be observed by a reflection electron diffraction, Raman spectroscopy or the like.

The insulation film ES is formed by a CVD method using silicon dioxide ($SiO_2$ and the like) as a material, for example. As described later, the insulation film ES plays a role of preventing etching from reaching the first semiconductor film S at the time of forming the third semiconductor film DS by etching using the drain electrode DT or the like as a mask.

The drain electrode DT and the source electrode ST are mainly made of metal such as aluminum, and are formed such that these electrodes DT, ST cover two third semiconductor films DS respectively. Between the drain electrode DT and the drain-electrode-side edge portion DR as well as between the source electrode ST and the source-electrode-side edge portion SR, the third semiconductor film DS made of amorphous silicon doped with impurities of high concentration and the second semiconductor film AS formed by stacking amorphous silicon are interposed.

Figure 9A:
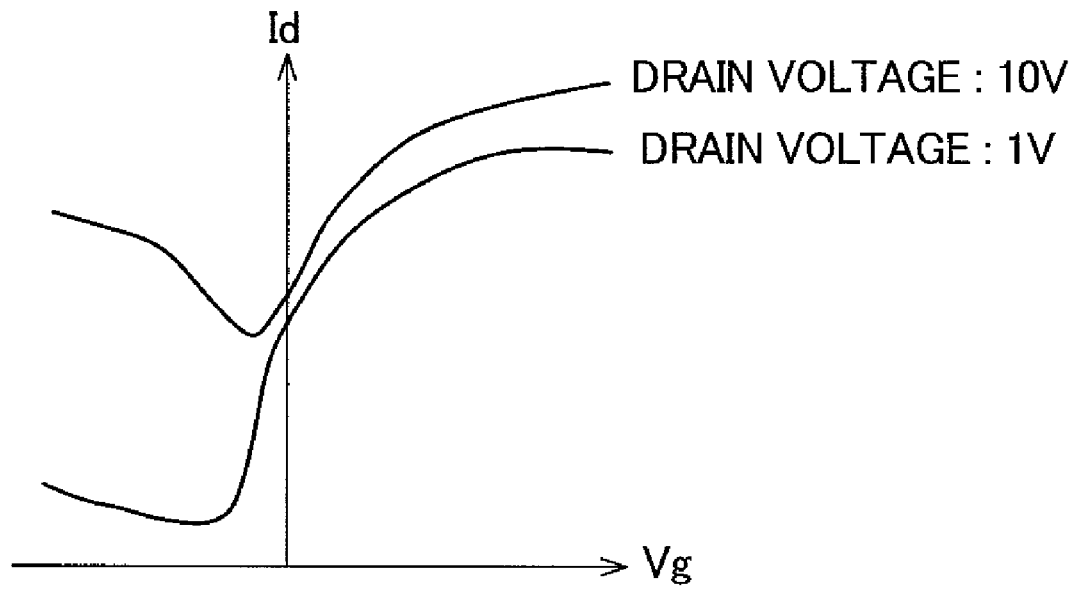
FIG. 9A is a graph showing characteristics of a gate voltage and a drain current of the thin film transistor shown in FIG. 8.
Figure 9B:
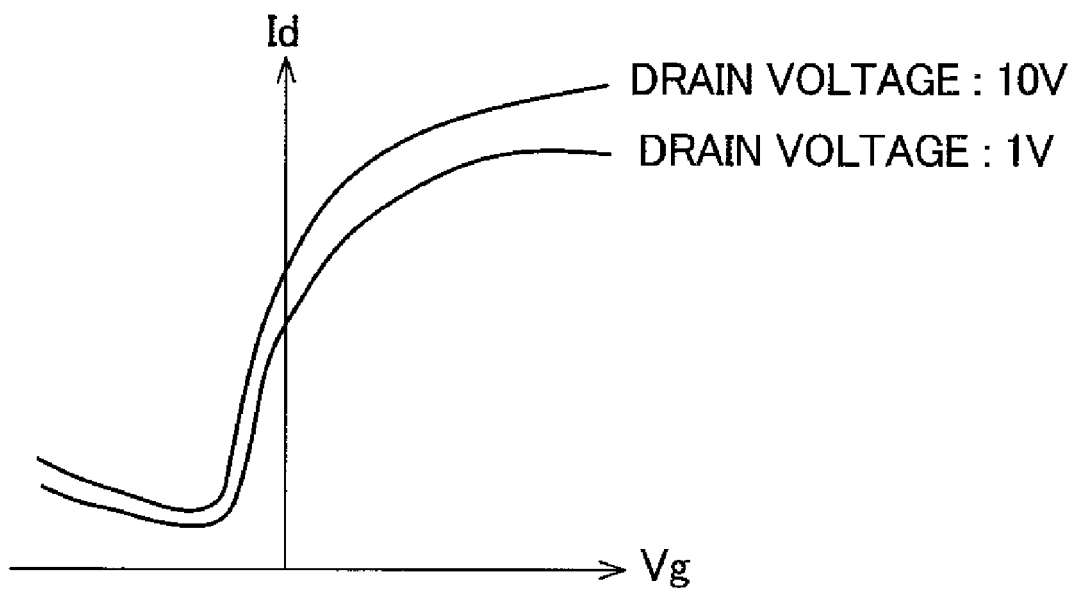
FIG. 9B is graph showing characteristics of a gate voltage and a drain current of the thin film transistor shown in FIG. 3.

Due to such structure, the source-electrode-side edge portion SR and the drain-electrode-side edge portion DR of the first semiconductor film S made of micro-crystalline silicon or polycrystalline silicon are connected with the source electrode ST and the drain electrode DT respectively by an ohmic contact by way of the second semiconductor film AS. Accordingly, due to an electric-field-concentration reducing effect which the second semiconductor film AS having resistance higher than resistance of the third semiconductor film DS exhibits, the potential difference applied between the drain-electrode-side edge portion DR and the gate electrode GT is lowered. This lowering of potential difference alleviates the concentration of electric field which takes place in the gate insulation film GI1 in a region sandwiched between the gate electrode GT and the drain electrode DT so that it is possible to suppress an OFF current even when the drain electrode DT assumes a high potential (FIG. 9B).

The structure and the manner of operation of the thin film transistor TFT on the TFT substrate SUB according to this embodiment have been explained heretofore. A manufacturing method of such a thin film transistor TFT is explained in conjunction with FIG. 4A to FIG. 4L and FIG. 5A to FIG. 5C hereinafter.

Figure 4A:
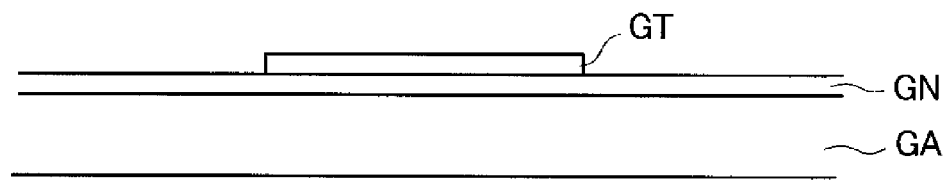
FIG. 4A to FIG. 4L are views showing a mode in which a thin film transistor TFT of the display device according to the embodiment is manufactured.

First of all, a contamination prevention film GN is formed on a transparent substrate GA such as a glass substrate, and the gate electrode GT is formed on the contamination prevention film GN (FIG. 4A). The contamination prevention film GN is formed by stacking silicon nitride (SiN) by a CVD method, for example. Further, the gate electrode GT is formed using a conductive metal such as molybdenum, for example, and the gate electrode GT is formed into a shape shown in the drawing by a known photolithography step and a known etching step performed sequentially.

Figure 4B:
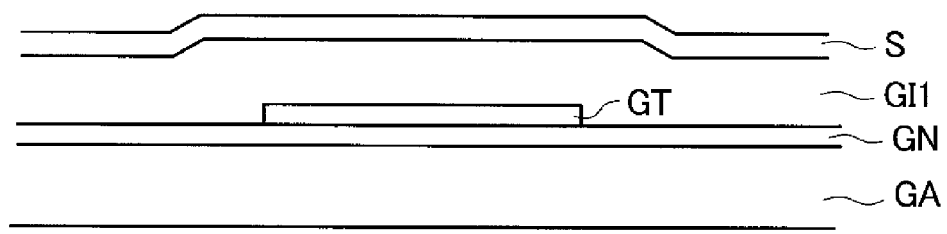

Next, the gate insulation film GI1 is formed so as to cover the gate electrode GT, and the first semiconductor film S is formed on the gate insulation film GI1 (FIG. 4B). The gate insulation film GI1 is formed by stacking silicon dioxide, for example, by a CVD method. The first semiconductor film S is formed such that amorphous silicon is firstly stacked by a CVD method and, then, amorphous silicon is crystallized into polysilicon using an excimer laser or by an RTA (Rapid Thermal Anneal) method. Here, amorphous silicon may be crystallized into microcrystalline silicon by applying heat treatment to amorphous silicon.

Figure 4C:
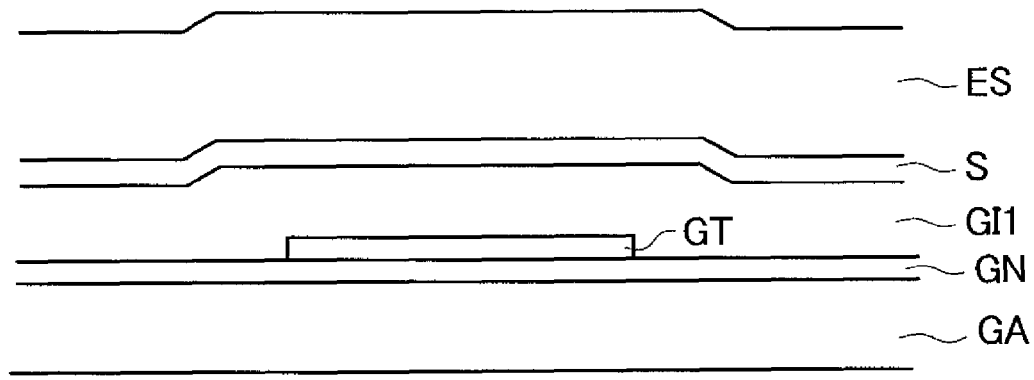
Figure 4D:
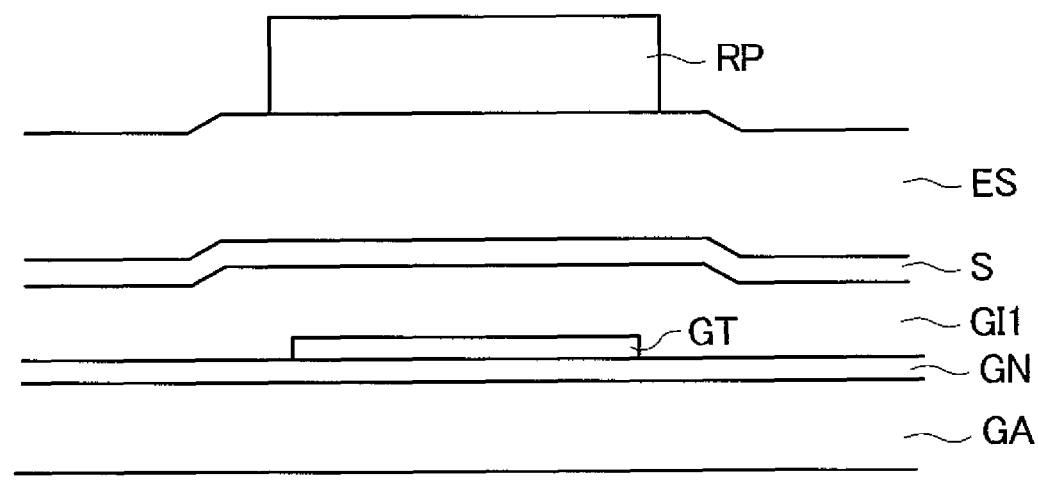

Next, the insulation film ES is formed on the crystallized semiconductor film S in a state where the insulation film ES is in contact with an upper surface of the semiconductor film S. The insulation film ES is formed by stacking silicon dioxide on the crystallized semiconductor film S by a CVD method (FIG. 4C). Then, a resist pattern RP is formed on the insulation film ES by a known photolithography step (FIG. 4D). In this known photolithography step, first of all, photo resist is applied to the insulation film ES by coating, and ultraviolet rays or the like are radiated to the photo resist using a photo mask on which a predetermined pattern is formed. Then, a pattern corresponding to the pattern of the photo mask is transferred to the photo resist thus forming portions to which excimer laser beams are radiated and portions to which excimer laser beams are not radiated in the photo resist. Here, a chemical reaction is produced in the portions of the photo resist to which the excimer laser beams are radiated. Then, in a development process, the portion of the photo resist where the chemical reaction is produced or the portions of the photo resist where the chemical reaction is not produced are removed thus forming the resist pattern RP. Here, the resist pattern RP is formed into a shape necessary for forming the first semiconductor film S.

Figure 4E:
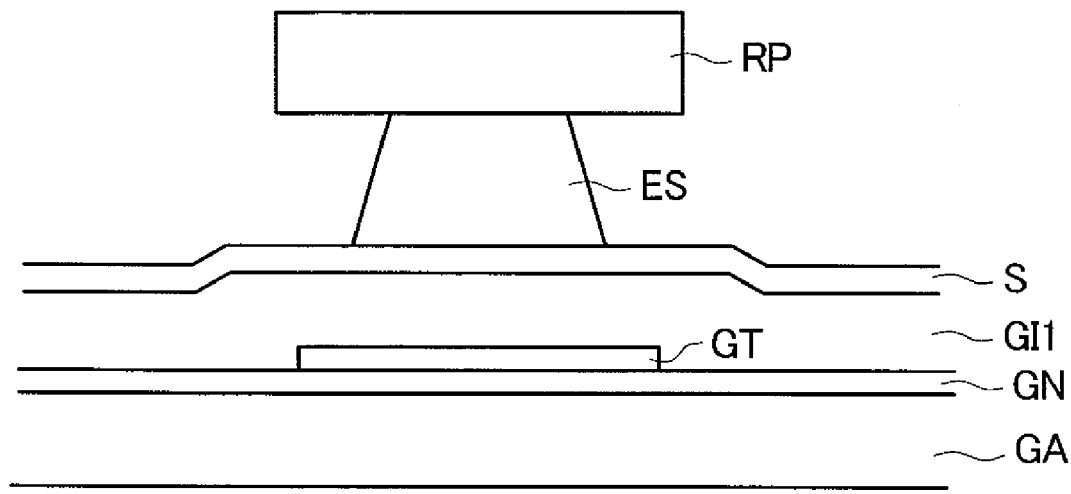
Figure 4F:
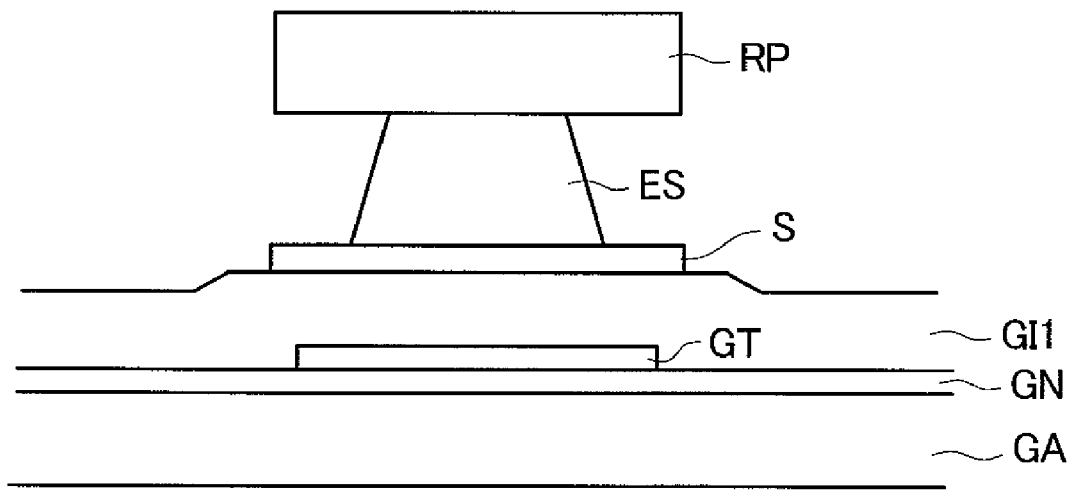

Here, using the resist pattern RP as a mask, wet etching is applied to the insulation film ES using a fluorine-based etchant thus forming the stacked insulation film ES into a desired shape (FIG. 4E). Here, side etching is applied to the insulation film ES so that portions of the insulation film ES which are positioned inside the resist pattern RP are also etched. Due to such etching, the insulation film ES is formed into a tapered shape. That is, as shown in FIG. 4E, the insulation film ES is formed into a laterally symmetrical trapezoidal shape in cross section. After formation of the insulation film ES by wet etching, dry etching is applied to the first semiconductor film S using the resist pattern RP thus forming the first semiconductor film S into a pattern substantially equal to the resist pattern RP (FIG. 4F). The insulation film ES is etched substantially uniformly inwardly from both outer extended portions of the resist pattern RP by side etching. Accordingly, the insulation film ES is formed in a region which has the center thereof positioned at the substantially center of the first semiconductor film S.

Figure 4G:
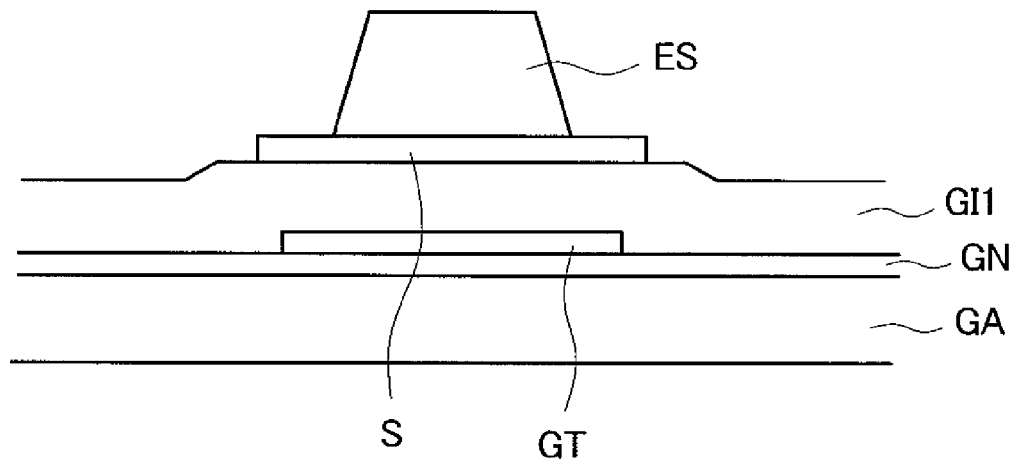
Figure 5A:
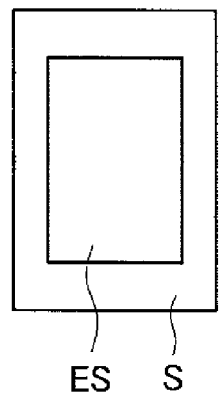
FIG. 5A to FIG. 5C are top views showing a mode in which the thin film transistor is formed respectively.

Then, the resist pattern RP is removed by aching which uses oxygen plasma or the like (FIG. 4G). FIG. 5A is a top view showing a state of the first semiconductor film S and the insulation film ES in FIG. 4G after formation of these films. As described above, the first semiconductor film is etched by dry-etching in accordance with the shape of the resist pattern RP, and the portions of the insulation film ES which are disposed inside the resist pattern RP are corroded by wet etching. Accordingly, outer peripheral portions of the first semiconductor film S are formed in a state where the outer peripheral portions are exposed from the insulation film ES.

Figure 4H:
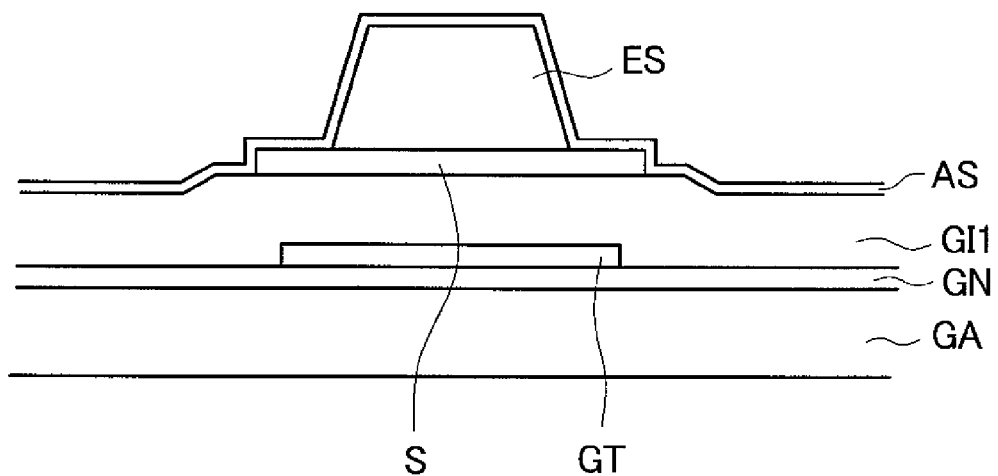
Figure 4I:
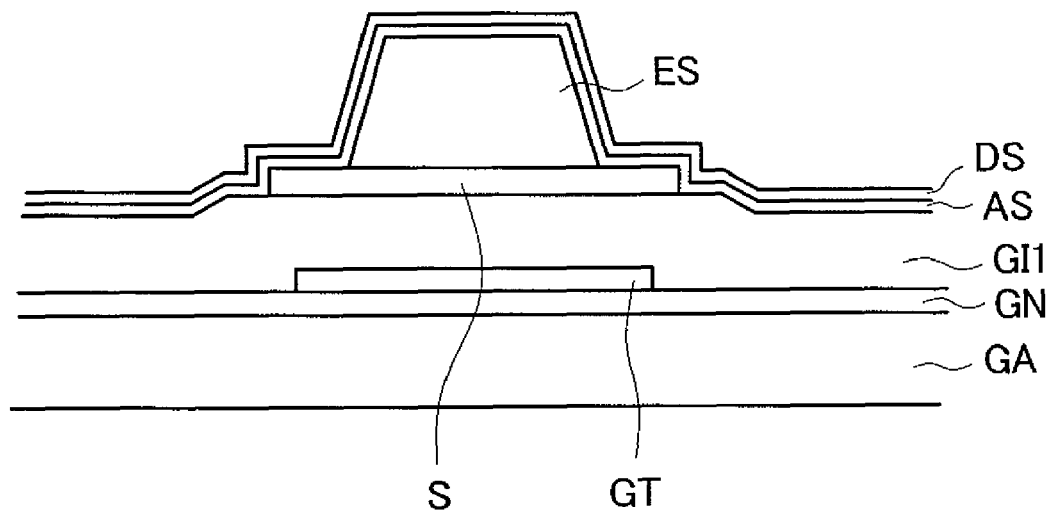
Figure 4J:
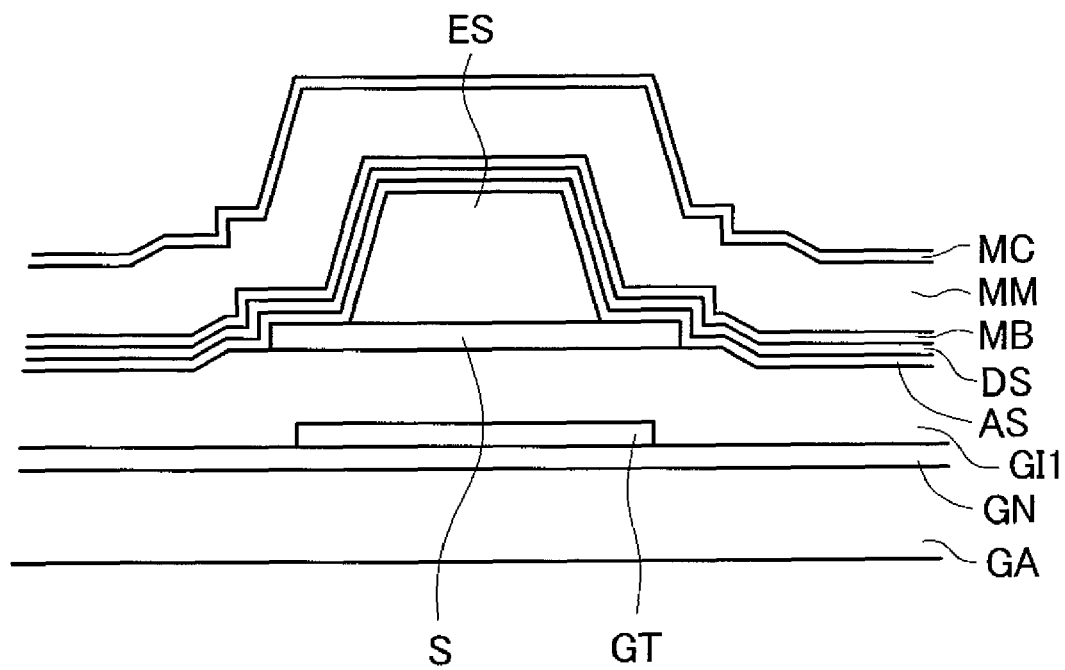

In this embodiment, particularly, the second semiconductor film AS is formed by stacking amorphous silicon on a front surface of the structure shown in FIG. 4G by a CVD method, (FIG. 4H). Further, after formation of the second semiconductor film by stacking amorphous silicon, the third semiconductor film is formed by continuing stacking of the amorphous silicon on the second semiconductor film AS while adding impurities such as phosphorous to the amorphous silicon (FIG. 4I). By adopting such steps, the second semiconductor film AS and the third semiconductor film DS are easily formed. Then, the drain electrode DT and the source electrode ST are formed on the third semiconductor film DS (FIG. 4J). The drain electrode DT and the source electrode ST are formed by stacking a barrier metal layer MB, a main line layer MM and a cap metal layer MC in this order from below using a sputtering method. Here, the barrier metal layer MB and the cap metal layer MC are respectively formed of a conductive thin metal film made of metal having a high melting point such as titanium, tungsten, chromium or molybdenum, for example, and are stacked on each other. These layers have a function of protecting the main line layer MM. The main line layer MM is made of aluminum or an alloy which contains aluminum. Accordingly, the drain electrode DT and the source electrode ST can ensure a reliable ohmic contact with the third semiconductor film DS made of amorphous silicon doped with impurities. FIG. 4I shows a case where the third semiconductor film DS is formed by adding impurities to the amorphous silicon while continuing stacking of the amorphous silicon for forming the second semiconductor film AS. However, in the step of forming the third semiconductor film DS, the third semiconductor film DS may be formed such that the amorphous silicon for forming the second semiconductor film AS is continuously stacked on the second semiconductor film AS and, thereafter, impurities are implanted into the continuously stacked amorphous silicon at high concentration.

Figure 4K:
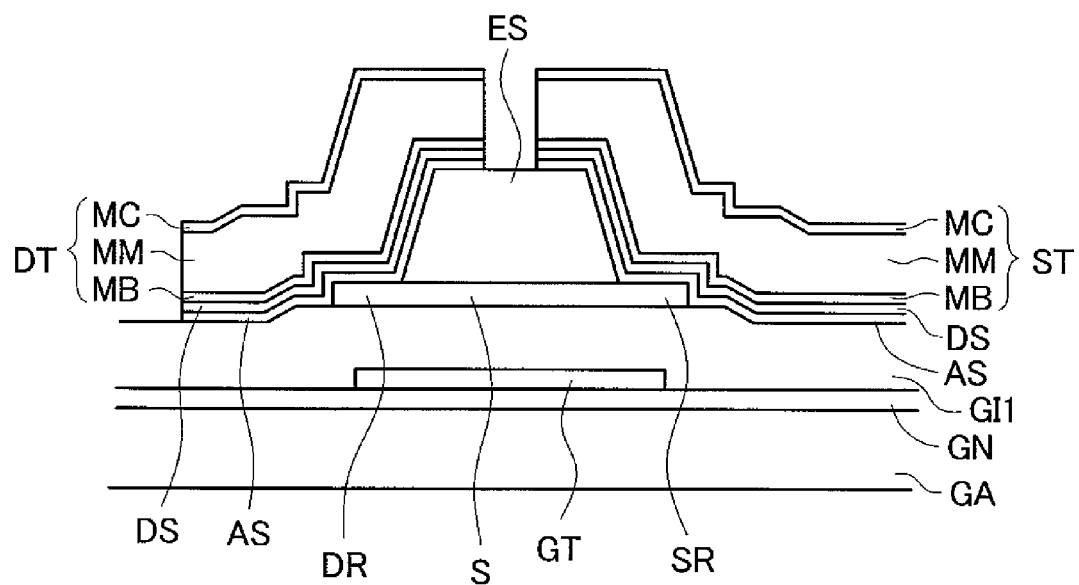

Thereafter, the cap metal layer MC, the main line layer MM, the barrier metal layer MB, the third semiconductor film DS and the second semiconductor film AS are formed into desired shapes by known photolithography steps and known etching steps (FIG. 4K).

Figure 5B:
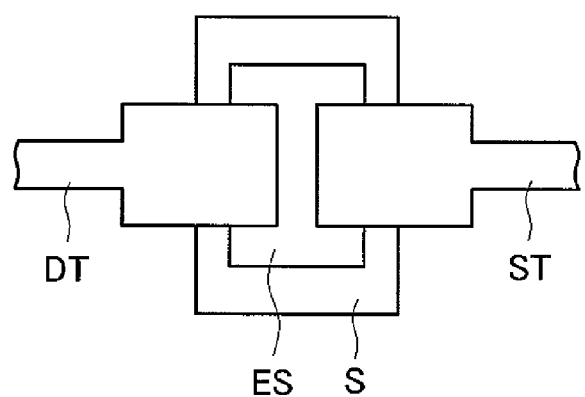
Figure 5C:
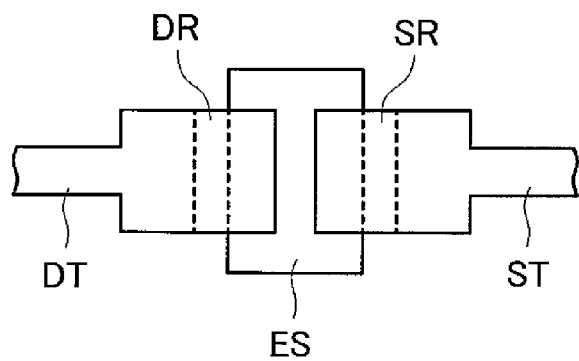
Figure 6:
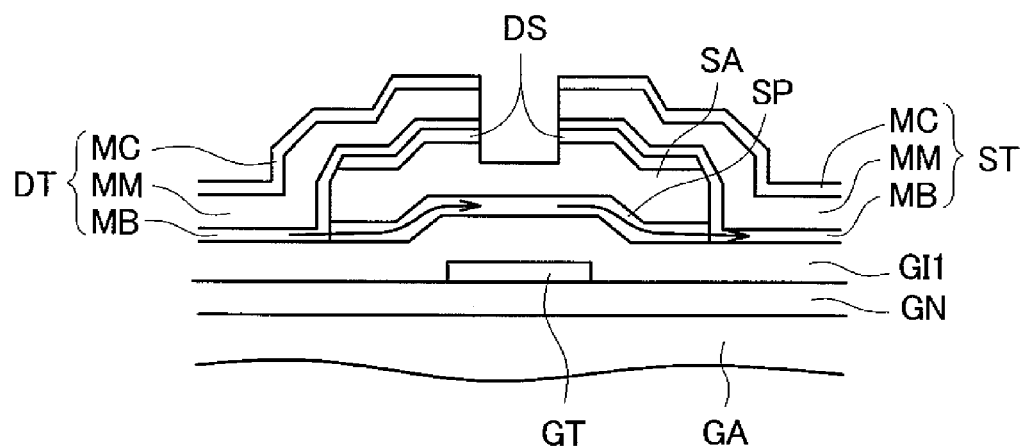
FIG. 6 is a view showing a thin film transistor having the bottom gate structure in the same manner as a thin film transistor described in patent document 1.
Figure 7:
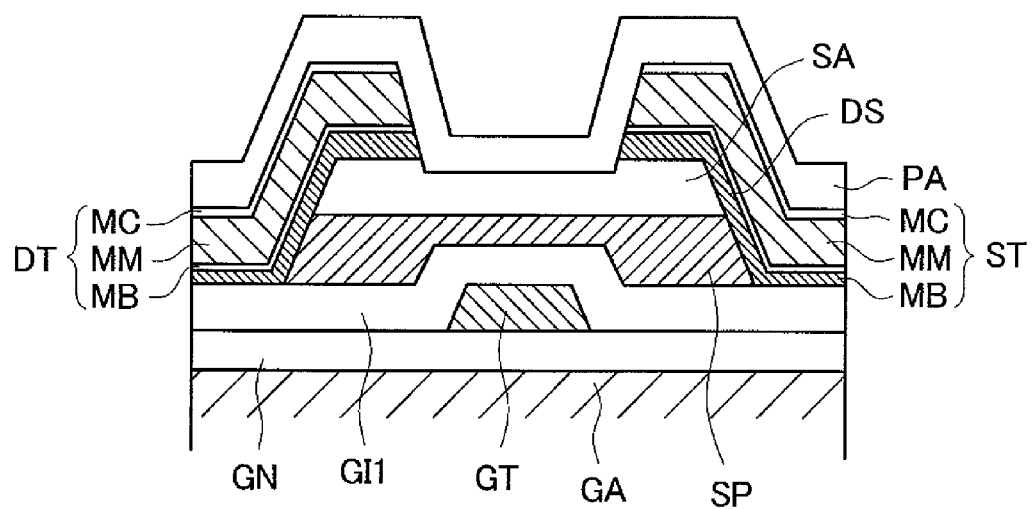
FIG. 7 is a view showing the structure which inventors of the present invention studied with respect to the structure of the thin film transistor shown in FIG. 6.
Figure 8:
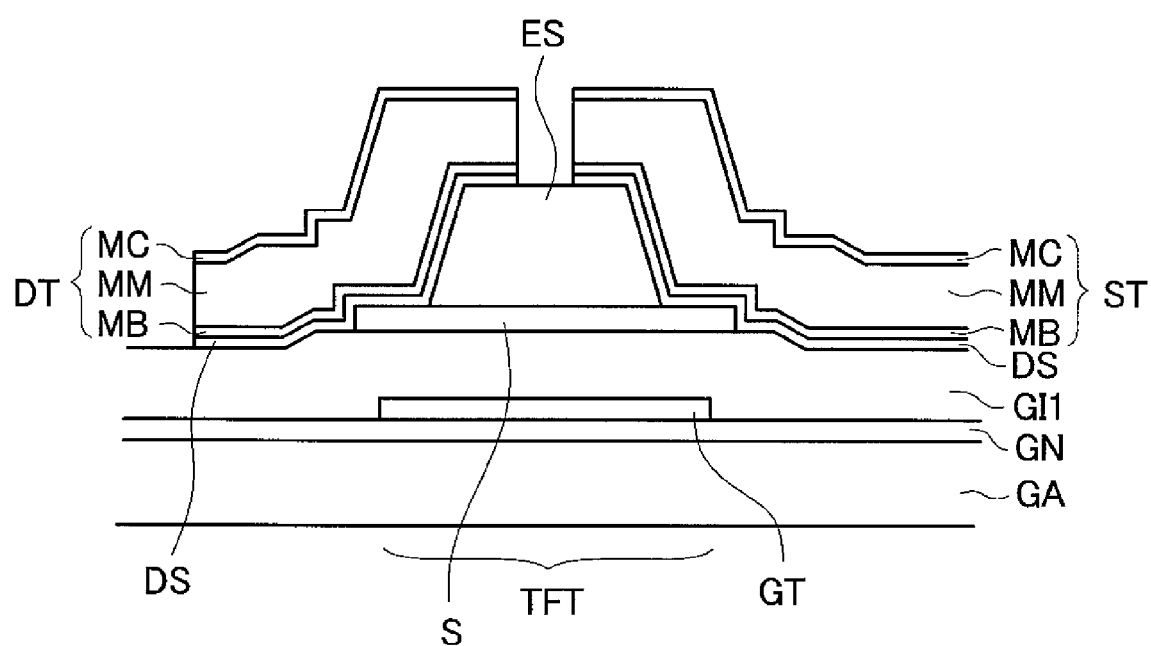
FIG. 8 is a view showing the structure which inventors of the present invention studied with respect to the structure of the thin film transistor shown in FIG. 7.

FIG. 5B and FIG. 5C are top views showing a state where the respective layers shown in FIG. 4K are formed into the desired shapes. First of all, a resist pattern for forming the drain electrode DT and the source electrode ST is formed on the cap metal layer MC. Then, in accordance with the resist pattern, the cap metal layer MC, the main line layer MM and the barrier metal layer MB are formed by wet etching thus forming the drain electrode DT and the source electrode ST (FIG. 5B). Next, dry etching is performed using the drain electrode DT and the source electrode ST as a mask thus integrally forming the third semiconductor film DS and the second semiconductor film AS in accordance with the shapes of the drain electrode DT and the source electrode ST. Accordingly, the third semiconductor film DS and the second semiconductor film AS are stacked with a pattern shape equal to the pattern shape of the drain electrode DT and the like (FIG. 5B).

Then, the third semiconductor film DS and the second semiconductor film AS are continuously etched by dry etching so that outer peripheral portions of the first semiconductor film S which are exposed from the drain electrode DT, the source electrode ST and the insulation film ES are formed into a desired shape thus forming the drain-electrode-side edge portion DR and the source-electrode-side edge portion SR (FIG. 5C). The drain-electrode-side edge portion DR and the like are formed at a portion of the first semiconductor film S which is exposed from the insulation film ES and also overlaps with the drain electrode DT and the like. All of the third semiconductor film DS, the second semiconductor film AS and the first semiconductor film S are made of silicon and hence, all of these films can be formed into desired shapes respectively using the same dry-etching process. Here, the insulation film ES works as an etching stopper which prevents dry etching from reaching the portion of the first semiconductor film S.

Figure 4L:
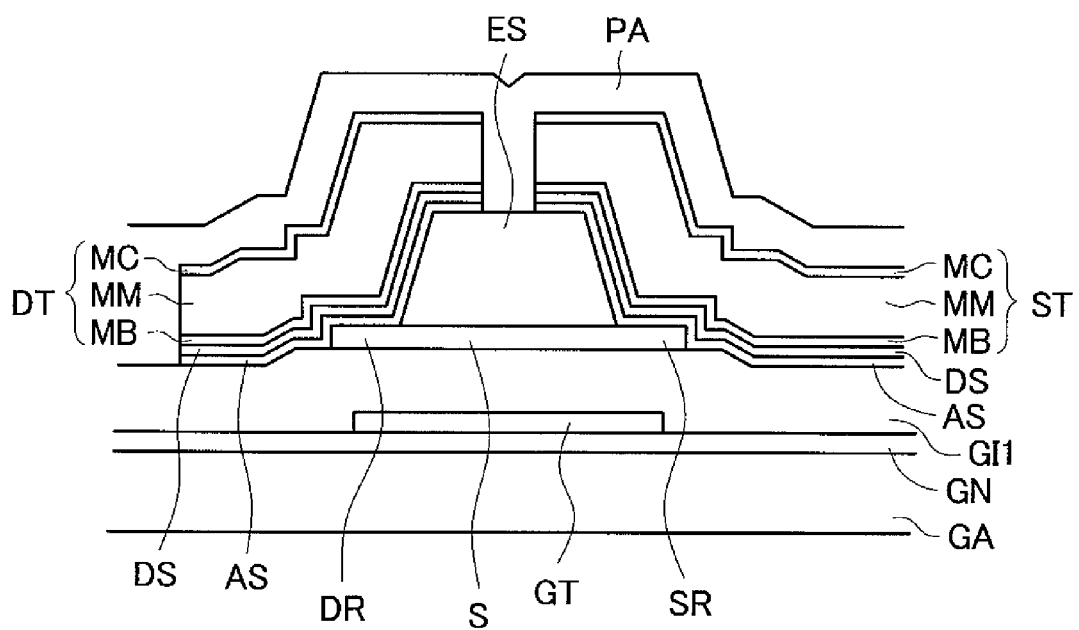

Finally, a passivation film PA made of silicon nitride is formed on the above-mentioned structure by a plasma CVD method (FIG. 4L). The passivation film PA covers the thin film transistor TFT which is formed in the above-mentioned manner so as to protect the thin film transistor TFT.

Between the drain electrode DT and the drain-electrode-side edge portion DR as well as between the source electrode ST and the source-electrode-side edge portion SR, the second semiconductor film AS and the third semiconductor film DS are stacked. Each of the drain-electrode-side edge portion DR and the source-electrode-side edge portion SR is covered with the second semiconductor film AS made of amorphous silicon having electron mobility lower than electron mobility of the first semiconductor film S made of polycrystalline silicon or microcrystalline silicon. The third semiconductor film DS is formed so as to cover the second semiconductor film AS from above. Further, the drain electrode DT is formed so as to cover one third semiconductor film DS, and the source electrode ST is also formed so as to cover the other third semiconductor film DS. The third semiconductor films DS are made of amorphous silicon doped with impurities of high concentration. The respective third semiconductor films DS are connected with the drain electrode DT and the source electrode ST respectively by an ohmic contact. The second semiconductor film AS made of amorphous silicon contains a quantity of impurities which constitute carriers smaller than a quantity of impurities contained in the third semiconductor film DS. Accordingly, the second semiconductor film AS exhibits resistance higher than resistance of the third semiconductor film DS. The third semiconductor film DS and the second semiconductor film AS are integrally formed with the drain electrode DT and the source electrode ST respectively by dry etching using the drain electrode DT and the source electrode ST as masks.

Figure 10:
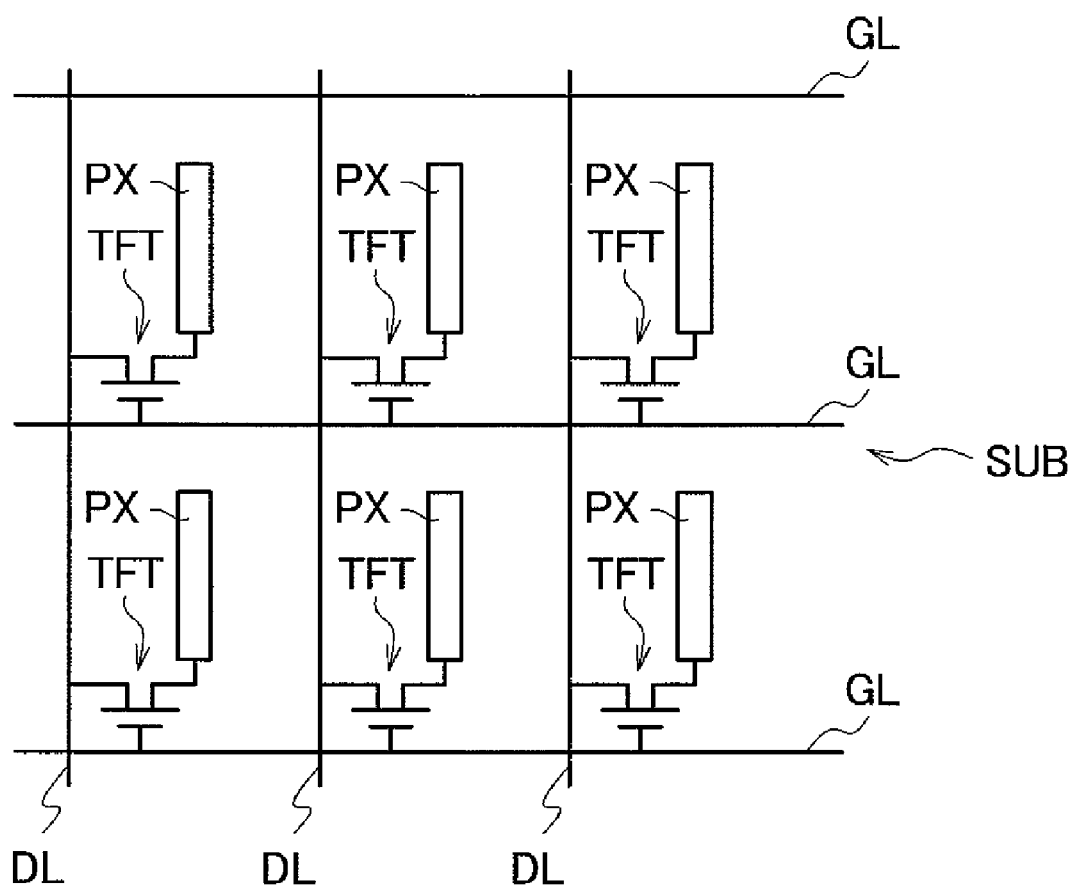
FIG. 10 is a view showing one example of an equivalent circuit diagram of a TFT substrate which constitutes a VA-type or a TN-type display device.
Figure 11:
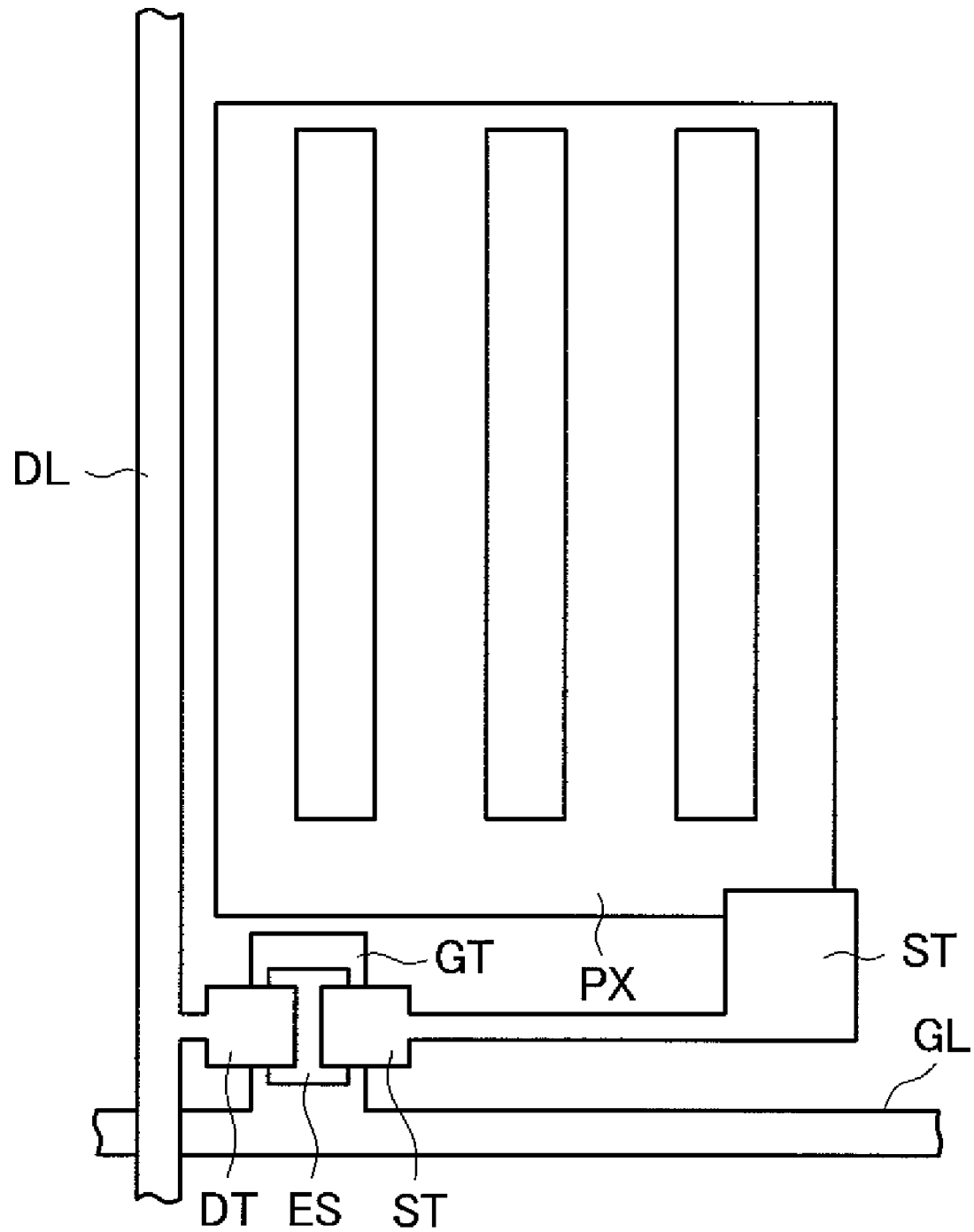
FIG. 11 is an enlarged plan view showing one example of a pixel region of a VA-type or a TN-type TFT substrate.

Here, in the liquid crystal display device according to the embodiment of the present invention which has been explained heretofore, the IPS method is adopted as the drive method of liquid crystal. However, the present invention is also applicable to a liquid crystal display device which adopts other drive methods such as a VA (Vertically Aligned) method or a TN (Twisted Nematic) method, for example. FIG. 10 is a view showing an equivalent circuit of a TFT substrate SUB of a display device which adopts a VA method or a TN method, and FIG. 11 is an enlarged plan view showing a pixel region of the TFT substrate SUB of the display device which adopts the VA method or the TN method. In the display device which adopts the VA method or the TN method, the counter electrodes CT and the common signal lines CL are formed on a counter substrate which faces the TFT substrate in an opposed manner and forms color filters thereon.

Here, in the above-mentioned embodiment of the present invention, the display device is explained by taking the liquid crystal display device as an example. However, it is needless to say that the present invention is not limited to the above-mentioned liquid crystal display device and is also applicable to other display devices such as a display device which adopts organic EL (Electro Luminescence) elements, for example.

Here, the greater the film thickness of the second semiconductor film AS, the greater the resistance of the second semiconductor film becomes. In this case, the concentration of the electric field is further alleviated so that an OFF current is suppressed. In this manner, the thickness of the second semiconductor film AS is determined such that the ON current and the OFF current are appropriated or assume appropriate values respectively. Further, aiming at the suppression of the OFF current, the drain-electrode-side edge portion DR and the source-electrode-side edge portion SR of the first semiconductor film S may be doped with impurities of low concentration. In this case, impurities such as phosphorous (P) are implanted into the first semiconductor film S using the insulation film ES as a mask in FIG. 4G. In implanting the impurities, the impurities are accelerated by an electric field due to the ionization thereof by an ion injecting apparatus, and are injected into the TFT substrate which constitutes an object to be formed uniformly in plane in the direction substantially perpendicular to the TFT substrate. The drain-electrode-side edge portion DR and the source-electrode-side edge portion SR into which the impurities are implanted form a PN junction with a channel layer, and a depletion layer is formed on boundaries between the channel layer and the drain-electrode-side edge portion DR and the source-electrode-side edge portion SR. Due to the formation of the drain-electrode-side edge portion DR and the source-electrode-side edge portion SR into which the impurities are implanted as well as the second semiconductor film AS, even when a higher voltage is applied to the drain electrode DT and the source electrode ST, the concentration of the electric field is alleviated.

In the display device according to the above-mentioned embodiment, the third semiconductor film DS is formed by adding the impurities such as phosphorous of high concentration to amorphous silicon so that an ohmic contact is established between the third semiconductor film DS and the drain electrode DT as well as between the third semiconductor film DS and the source electrode ST. However, the third semiconductor film DS may be made of any material which brings an ohmic contact between the third semiconductor film DS and at least the drain electrode DT and the source electrode. Further, in the above-mentioned embodiment, the first semiconductor film S is made of polycrystalline silicon or microcrystalline silicon, the second semiconductor film AS is formed by stacking amorphous silicon having electron mobility lower than electron mobility of the first semiconductor film S, and the third semiconductor film DS is formed by adding impurities to amorphous silicon. However, it is sufficient that a condition that the resistance of the second semiconductor film AS is higher than the resistance of the third semiconductor film DS is satisfied. To be more specific, the first semiconductor film S may be made of polycrystalline silicon, and the second semiconductor film AS is made of microcrystalline silicon, and the third semiconductor film DS may be made of microcrystalline silicon doped with impurities at high concentration. Further, the second semiconductor film AS may be made of amorphous silicon doped with low-concentration impurities, the third semiconductor film DS may be made of amorphous silicon doped with high-concentration impurities so that the second semiconductor film AS has the resistance higher than the resistance of the third semiconductor film DS.

The display device according to the embodiment of the present invention explained heretofore is not limited by the above-mentioned embodiment and may be modified within a range of the technical concept.

What is claimed is:

1. A display device comprising:
   a transparent substrate; and
   a plurality of thin film transistors which are formed on the transparent substrate, each of the thin film transistors including:
   a gate electrode which is stacked on the transparent substrate;
   a source electrode and a drain electrode which are stacked over the gate electrode;
   a first semiconductor film which is stacked between the gate electrode, and the source electrode and the drain electrode so as to control an electric current which flows between the source electrode and the drain electrode;
   an insulation film which is stacked on the first semiconductor film in a contacting manner in a state where a source-electrode-side edge portion and a drain-electrode-side edge portion of the first semiconductor film are exposed; and
   a second semiconductor film and a third semiconductor film which are stacked between the source-electrode-side edge portion and the source electrode as well as between the drain-electrode-side edge portion and the drain electrode,
   wherein the third semiconductor film is connected with the source electrode and the drain electrode by an ohmic contact,
   the second semiconductor film is formed below the third semiconductor film with resistance higher than resistance of the third semiconductor film,
   the second semiconductor film and the third semiconductor film are integrally formed with the source electrode and the drain electrode respectively,
   the source electrode, and the second semiconductor film and the third semiconductor film which are integrally formed with the source electrode cover a portion of the insulation film and the source-electrode-side edge portion, and
   the drain electrode, and the second semiconductor film and the third semiconductor film which are integrally formed with the drain electrode cover a portion of the insulation film and the drain-electrode-side edge portion.

2. A display device according to claim 1, wherein the second semiconductor film is made of a predetermined material, and the third semiconductor film is formed by adding impurities to the predetermined material.

3. A display device according to claim 2, wherein the first semiconductor film is made of polycrystalline silicon or microcrystalline silicon, the second semiconductor film is made of amorphous silicon, and the third semiconductor film is formed by adding the impurities to the amorphous silicon.

4. A display device according to claim 1, wherein the source-electrode-side edge portion and the drain-electrode-side portion have an upper surface and a side surface,
   the second semiconductor film is on and in physical contact with the upper surface and the side surface.

5. A display device according to claim 1, wherein the insulation film has a first surface which is in physical contact with the first semiconductor film and a second surface which is opposite to the first surface,
   the source electrode faces the drain electrode on the second surface.

* * * * *